United States Patent [19]

Bae

[11] Patent Number: 5,902,701
[45] Date of Patent: *May 11, 1999

[54] PHASE SHIFT MASK AND METHOD FOR FABRICATING THE SAME

[75] Inventor: Sang Man Bae, Kyoungki-do, Rep. of Korea

[73] Assignee: Hyundai Electronics Industries Co. Ltd., Kyoungki-do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/621,796

[22] Filed: Mar. 22, 1996

[30] Foreign Application Priority Data

Mar. 24, 1995 [KR] Rep. of Korea ................. 95-6326

[51] Int. Cl.⁶ ........................................... G03F 9/00
[52] U.S. Cl. ........................................................ 430/5
[58] Field of Search .............................. 430/5; 216/12

[56] References Cited

U.S. PATENT DOCUMENTS

| | | | |
|---|---|---|---|
| 5,047,822 | 9/1991 | Little, Jr. et al. | 357/30 |
| 5,122,844 | 6/1992 | Akiba et al. | 357/17 |
| 5,328,786 | 7/1994 | Miyazaki et al. | 430/5 |
| 5,380,608 | 1/1995 | Miyazhita et al. | 430/5 |
| 5,478,678 | 12/1995 | Yang et al. | 430/5 |
| 5,510,214 | 4/1996 | Pan et al. | 430/5 |
| 5,567,552 | 10/1996 | Ham | 430/5 |
| 5,620,817 | 4/1997 | Hsu et al. | 430/5 |

Primary Examiner—Nam Nguyen
Assistant Examiner—Steven H. Versteeg
Attorney, Agent, or Firm—Thelen, Reid & Priest, LLP

[57] ABSTRACT

A phase shift mask including two phase shift film patterns formed on one or both surfaces of a transparent substrate such that their optical paths overlap with each other. On one of the phase shift film patterns, a phase shift film pattern having a space size smaller than that of the associated phase shift film pattern is formed, so that three phase shifts of light can be generated with reference to the phase shift film pattern, thereby causing an interference among adjacent light beams. Such a light interference results in an improvement in the image contrast and an increase in the gradient of the light intensity graph. As a result, it is possible to achieve an easy fabrication of micro patterns and an improvement in the process margin, operation reliability and process yield. The invention also provides a method for fabricating such a phase shift mask.

4 Claims, 3 Drawing Sheets

PHASE SHIFT MASK AND METHOD FOR FABRICATING THE SAME

BACKGROUND OF THE INVENTION

1. Field of the Invention

The present invention relates to a phase shift mask and a method for fabricating the same, and more particularly to a phase shift mask capable of sequentially phase-shifting the incident light three times near its light shield film pattern, thereby utilizing an interference effect between two electric fields.

2. Description of the Prior Art

The recent trend to fabricate semiconductor devices having a light, thin, simple and compact structure results in a reduced distance between adjacent wirings, an increased topology and a reduced size of unit elements such as transistors or capacitors. For this reason, the requirement to form photoresist film patterns with a micro dimension has been increased.

Generally, light exposure masks, which are used in the light exposure process for forming photoresist film patterns, are fabricated by coating a light shield film comprised of a chromium layer or aluminum layer over a quartz substrate, and then etching the light shield film in accordance with an ion beam etching method, thereby forming a light shield film pattern. However, with such general light exposure masks it is difficult to form patterns with a micro dimension smaller than the limit of the light resolution of steppers. Furthermore, with conventional photoresist solutions and steppers, for example, G-line steppers with the wavelength of 436 nm or I-line steppers with the wavelength of 365 nm, it is difficult to form patterns having a micro dimension of 0.5 $\mu$m or below.

On the other hand, semiconductor devices having a high integration degree of 64 Mega DRAM grade or greater need a micro pattern with a dimension of 0.5 $\mu$m or below. In order to form such a micro pattern, phase shift masks capable of forming photoresist film patterns exhibiting a high resolution have been used.

Typically, such phase shift masks have a phase shift film pattern adapted to shift the phase of light through an angle of 180° to 90° along with light shield film patterns so as to uniformly maintain the amplitude of light irradiated onto a wafer in the light exposure process. In other words, such a phase shift mask utilizes the principle of minimizing the light exposure effect resulting from the interference between the light passing through the phase shift film pattern and the light passing through a pattern disposed adjacent to the phase shift film pattern, thereby improving the resolution of a photoresist film pattern finally formed.

The phase shift film pattern is made of a phase shift material exhibiting a refractivity of n to have a thickness capable of shifting the phase of light with a wavelength of $\lambda$ through an angle of 160 to 200° so that the light irradiated onto a photoresist film can exhibit an increased contrast ratio. For example, for G-line or i-line incident light, the phase shift mask may have 3,400 to 4,000 Å when it is comprised of a spin-on-glass (SOG) film, oxide film or nitride film.

Where such phase shift masks are used, it is possible to form micro patterns having a dimension of 0.5 $\mu$m or below using conventional photoresist solution and steppers. Such phase shift masks are classified into the Levenson type and the edge emphasis type.

An example of a conventional phase shift mask will now be described in conjunction with FIGS. 1 to 3.

Referring to FIG. 1, a phase shift mask 2 is shown, which includes a transparent substrate 3 made of glass or quartz and a phase shift film pattern 4 formed on the transparent substrate 3. The phase shift film pattern 4 has alternately arranged lines and spaces respectively. On the phase shift film pattern 4, a light shield film pattern 5 comprised of a chromium film is formed. The light shield film pattern 5 has alternately arranged lines and spaces. The line width of the light shield film pattern 5 is smaller than that of the phase shift film pattern 4.

In the phase shift mask 2 having the above-mentioned structure, a 180° phase difference is exhibited between light 1 passing through the phase shift mask pattern 4 and light directly passing through the transparent substrate 3. In other words, electric fields 6 and 7 respectively established by the light passing the phase shift mask pattern 4 and the light directly passing through the transparent substrate 3 exhibit a 180° phase difference, as shown in FIG. 2.

As a result, the light beams reaching a wafer to be patterned interfere with each other as shown in FIG. 3, thereby improving the image contrast. In this case, however, there is a limitation on the depth of focus or the fineness of the pattern when the wavelength of light is constant. It, therefore, is difficult to increase the integration degree of semiconductor devices to a desired level.

SUMMARY OF THE INVENTION

Therefore, an object of the invention is to solve the above-mentioned problems involved in the prior art and to provide a phase shift mask capable of achieving an improvement in the optical contrast and an increase in the gradient of the contrast curve at both sides thereof, and a method for fabricating such a phase shift mask.

Another object of the invention is to provide a phase shift mask having multi-layered micro phase shift film patterns adapted to generate at least two phase shifts with reference to a light shield film pattern so that a sharp gradient of the image contrast can be obtained, thereby achieving a high integration of semiconductor devices and an improvement in the process margin, operation reliability and process yield.

Another object of the invention is to provide a method for fabricating a phase shift mask, involving forming multi-layered phase shift film patterns, and forming a light shield film pattern on the uppermost one of the phase shift film patterns, thereby achieving a high integration of semiconductor devices and an improvement in the operation reliability and process yield.

In accordance with one aspect, the present invention provides a phase shift mask comprising a transparent substrate, a phase shift film pattern and a light shield film pattern, the patterns being formed on the transparent substrate and respectively having spaces with different sizes and optical paths overlapping with each other, the phase shift mask further comprising: a multi-layered phase shift film pattern formed beneath the optical film pattern, the multi-layered phase shift film pattern having a space with a different size from those of the phase shift film pattern and light shield film pattern and an optical path overlapping with that of the phase shift film pattern such that light irradiated through the phase shift mask varies in phase three times with reference to the light shield film pattern in a sequential manner by virtue of the thickness of each pattern at its edge.

In accordance with another aspect, the present invention provides a phase shift mask comprising: a transparent substrate; a first phase shift film pattern formed on one surface of the transparent substrate, the first phase shift film pattern having a space with a desired size; a light shield film pattern formed on the first phase shift film pattern, the light shield film pattern having a space with a size larger than that of the first phase shift film pattern; and a second phase shift film pattern interposed between the first phase shift film pattern and light shield film pattern, the second phase shift film pattern having an optical path overlapping with the first phase shift film pattern and a space with a size larger than that of the first phase shift film pattern, but smaller than that of the light shield film pattern.

In accordance with another aspect, the present invention provides a phase shift mask comprising: a transparent substrate; a first phase shift film pattern formed on one surface of the transparent substrate, the first phase shift film pattern having a space with a desired size; a light shield film pattern formed on the first phase shift film pattern, the light shield film pattern having a space with a size larger than that of the first phase shift film pattern; and a second phase shift film pattern formed on the other surface of the transparent substrate, the second phase shift film pattern having a space with a size larger than that of the first phase shift film pattern, but smaller than that of the light shield film pattern and an optical path overlapping with the first phase shift film pattern.

In accordance with another aspect, the present invention provides a method for fabricating a phase shift mask, comprising the steps of: forming a first phase shift film pattern having a space with a desired size on one surface of a transparent substrate; forming a second phase shift film pattern on the first phase shift film pattern such that the second phase shift film pattern has an optical path overlapping with the first phase shift film pattern and a space with a size larger than that of the first phase shift film pattern; and forming a light shield film pattern on the second phase shift film pattern such that the light shield film pattern has a space with a size larger than that of the second phase shift film pattern.

In accordance with another aspect, the present invention provides a method for fabricating a phase shift mask, comprising the steps of: forming a first phase shift film pattern having a space with a desired size on one surface of a transparent substrate; forming a light shield film pattern on the first phase shift film pattern such that the light shield film pattern has a space with a size larger than that of the first phase shift film pattern; and forming a second phase shift film pattern on the other surface of the transparent substrate such that the second phase shift film pattern has an optical path overlapping with the first phase shift film pattern and a space with a size larger than that of the first phase shift film pattern, but smaller than that of the light shield film pattern.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
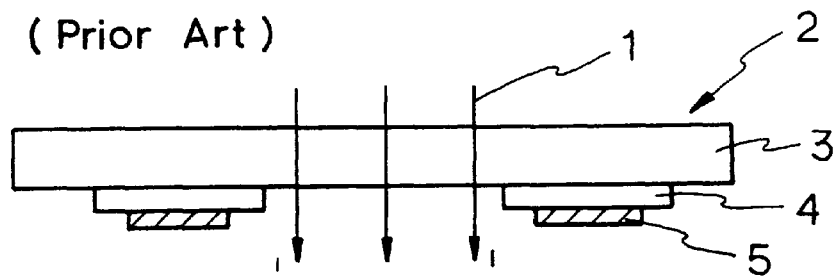
FIG. 1 is a sectional view illustrating a conventional phase shift mask.
Figure 2:
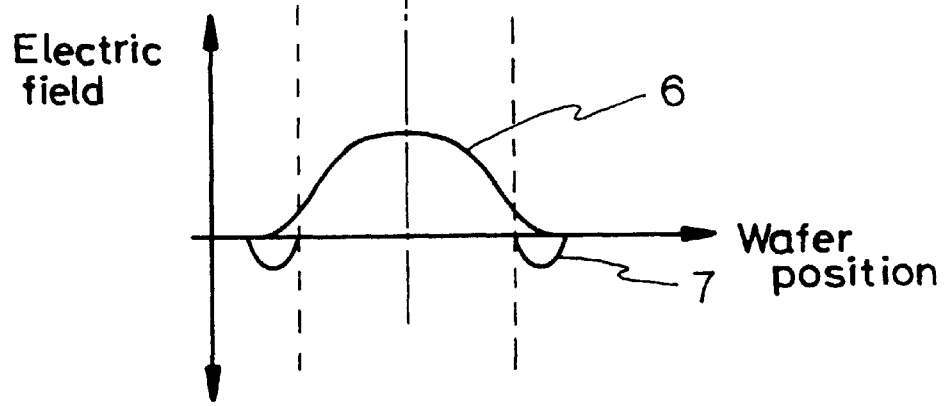
FIG. 2 is a graph showing the electric field distribution depending on the position of the phase shift mask shown in FIG. 1.
Figure 3:
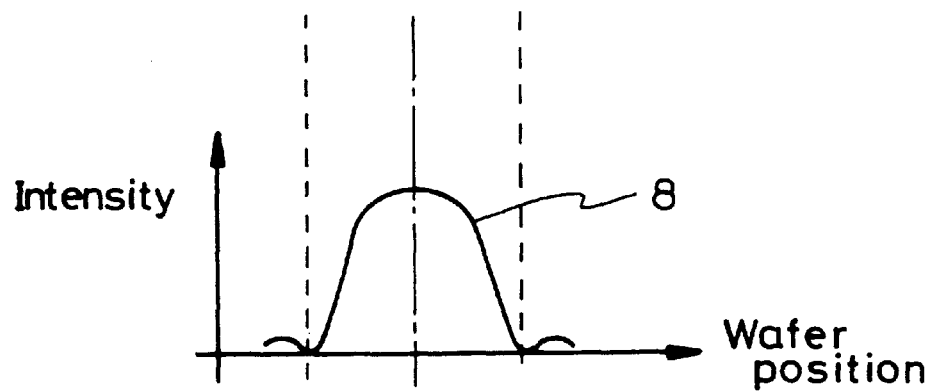
FIG. 3 is a graph showing the light intensity distribution 8 depending on the position of the phase shift mask shown in FIG. 1.
Figure 4A:
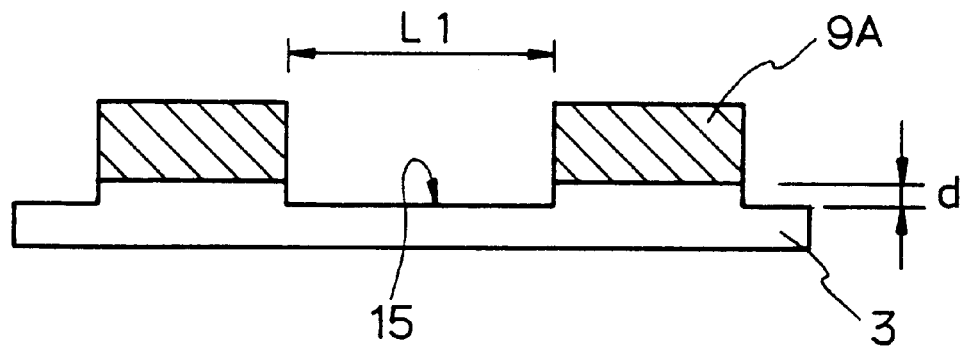
FIGS. 4A to 4D are sectional views respectively illustrating a method for fabricating a phase shift mask in accordance with an embodiment of the present invention.
Figure 4B:
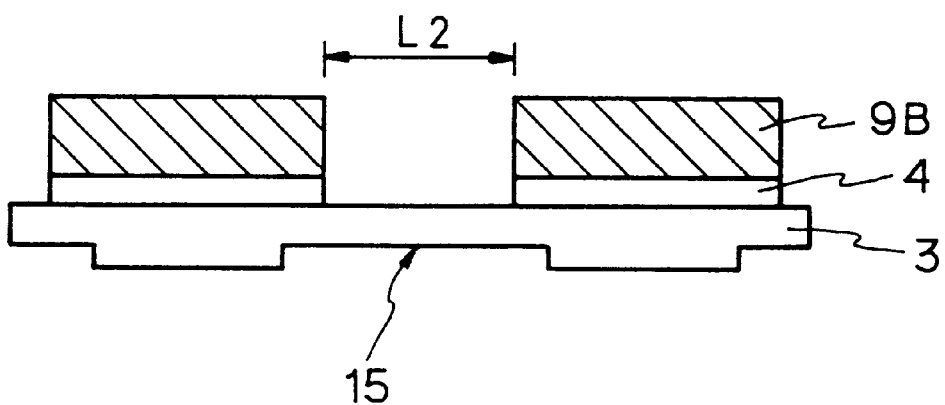
Figure 4C:
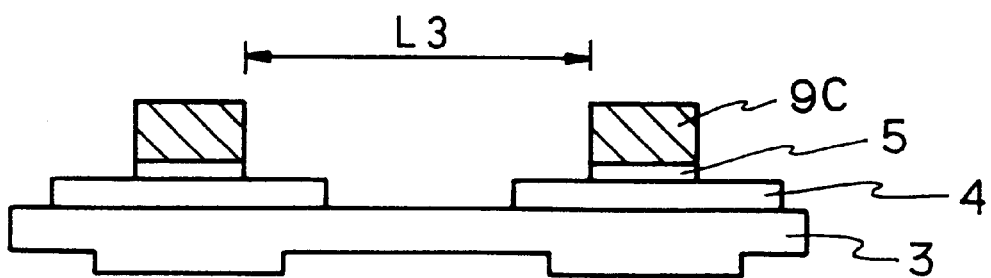
Figure 4D:
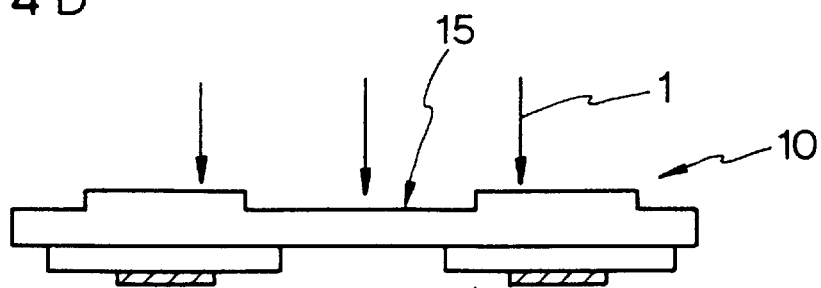

FIGS. 4A to 4D illustrate a method for fabricating a phase shift mask in accordance with an embodiment of the present invention wherein two phase shift film patterns are formed on opposite surfaces of a transparent substrate such that they overlap with each other. In particular, FIG. 4D shows a phase shift mask finally obtained.

In accordance with the method of the present invention, a first photoresist film pattern 9A, which has a desired line/space pattern, is first formed on one surface of a transparent substrate 3 made of glass or quartz. The exposed portion of the first photoresist pattern 9A not covered with the transparent substrate 3 is then etched to a desired depth d capable of shifting the electric field of light irradiated through an angle of 180°, thereby forming a groove 15 having a phase shift function. The depth d is determined by the equation of "$d=\lambda/Z(n'-1)$", where $\lambda$ is the wavelength of light irradiated, and n' is the refractivity of the substrate. In FIG. 4A, the width, namely, space of the groove 15 is denoted by "L1".

Thereafter, the first photoresist film pattern 9A is removed. A phase shift film is then formed over the other surface of the transparent substrate 3, as shown in FIG. 4B. On the phase shift film, a second photoresist film pattern 9B is formed. Using the second photoresist film pattern 9B as a mask, the phase shift film is then photo-etched, thereby forming a phase shift film pattern 4 having a desired thickness t. The phase shift film pattern 4 has portions overlapping with the groove 15. In other words, the space L2 defined between adjacent lines of the phase shift film pattern 4 is smaller than the space L1. On the other hand, the thickness t is determined, taking into consideration the equation of $t=\lambda/(n-1)$, where n is the refractivity of the phase shift film. The phase shift film pattern 4 is comprised of an SOG film, oxide film or nitride film.

After removing the second photoresist film pattern 9B a light shield film pattern 5 comprised of a chromium film is formed on the phase shift film pattern 4, using a third photoresist film pattern 9C as an etch mask, as shown in FIG. 4C. The light shield film pattern 5 has a line size smaller than the portion of the transparent substrate 3 protruded around the groove 15. In other words, the light shield film pattern 5 has a space L3 larger than the space L1.

Finally, the third photoresist film pattern 9C is removed. Thus, a phase shift mask 10 having two phase shift layers is obtained, as shown in FIG. 4D.

When light is irradiated onto a wafer under the condition that the phase shift mask 10 is used, its light beam 11 passing through both the transparent substrate 3 and phase shift film pattern 4 within the space of the phase shield film pattern 5 has a positive electric field level whereas its light beam 12 passing the phase shift film pattern 4 and the groove 15 of transparent substrate 3 near the light beam 11 has a negative electric field level. The light beam 13 passing through only the groove 15 of transparent substrate 3 has a negative electric field level.

Figure 5:
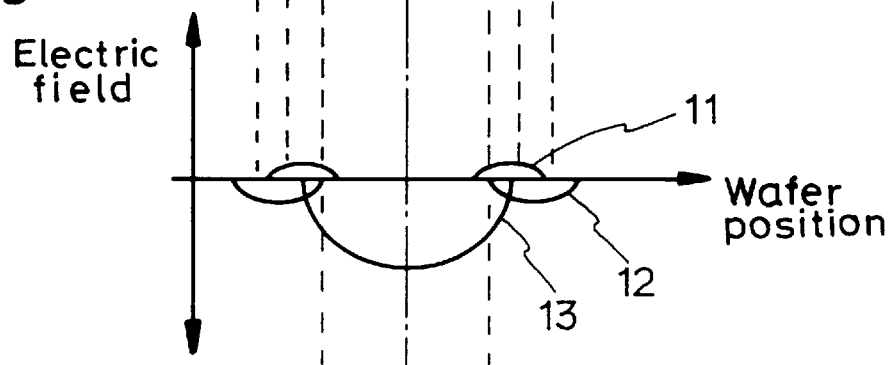
FIG. 5 is a graph showing the electric field distribution depending on the position of the phase shift mask shown in FIG. 4D.
Figure 6:
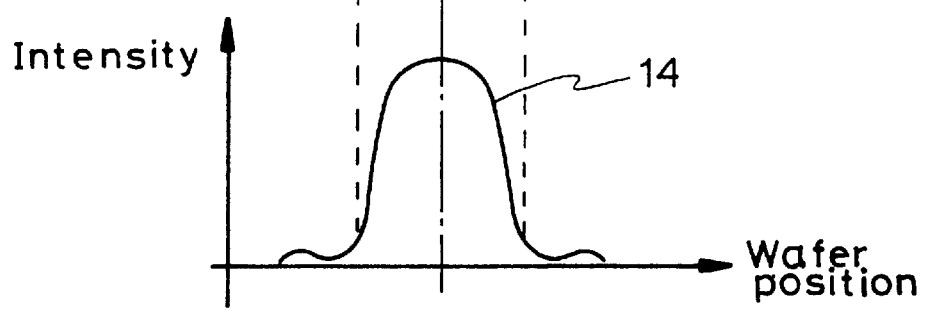
FIG. 6 is a graph showing the light intensity distribution depending on the position of the phase shift mask shown in FIG. 4D.

FIG. 6 shows the light intensity distribution 14 in the electric fields of FIG. 5 depending on the position of the phase shift mask shown in FIG. 4D. As shown in FIG. 6, the electric fields of FIG. 5 interfere with one another, thereby causing the image contrast to be improved. By the interference of the electric fields, the gradient of the light intensity graph also varies sharply. Although not shown, magnetic fields generated in the light exposure process also provide an interference effect as they vary in phase in similar to the electric fields.

Although the space L2 of the groove 15 is smaller than the space L3 of the phase shift film pattern 4 in the above-mentioned case, the same effect may be obtained when the space L2 is larger than the space L3.

Figure 7:
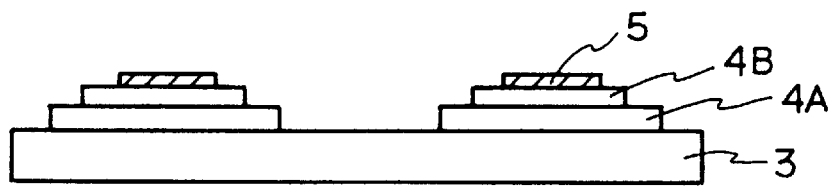
FIG. 7 is a sectional view illustrating a phase shift mask in accordance with another embodiment of the present invention.

FIG. 7 is a sectional view illustrating a phase shift mask in accordance with another embodiment of the present invention. In FIG. 7, elements respectively corresponding to those in FIGS. 4A to 4B are denoted by the same reference numeral. As shown in FIG. 7, the phase shift mask includes a transparent substrate 3 on which a first phase shift film pattern 4A, a second phase shift film pattern 4B and a light shield film pattern 5 respectively having spaces sequentially increasing in width are layered in a sequential manner. In order to achieve an easy fabrication, the first and second phase shift film patterns 4A and 4B are made of materials exhibiting an etch selectivity difference, respectively.

The first phase shift film pattern 4A may be replaced by a groove formed in the transparent substrate 3. In this case, the groove has the same width as the space of the first phase film pattern 4A. Of course, this phase shift mask provides the same effect as the phase shift mask 10.

In accordance with the present invention, another embodiment may be also implemented, which provides a phase shift structure capable of achieving three phase shifts of light with reference to the light shield film pattern, thereby obtaining an effect of further increasing the gradient of the light intensity graph by virtue of the increased light interference.

As apparent from the above description, in accordance with the present invention, a phase shift mask is provided, which includes two phase shift film patterns formed on one or both surfaces of a transparent substrate, such that their optical paths overlap with each other. On one of the phase shift film patterns, a phase shift film pattern having a space size smaller than that of the associated phase shift film pattern is formed, so that three phase shifts of light can be generated with reference to the phase shift film pattern, thereby causing an interference among adjacent light beams. Such a light interference results in an improvement in the image contrast and an increase in the gradient of the light intensity graph. As a result, it is possible to achieve an easy fabrication of micro patterns and an improvement in the process margin, operation reliability and process yield.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A phase shift mask comprising:
    a transparent substrate;
    phase shift film patterns formed on one surface of the transparent substrate, the phase shift film patterns having a desired size;
    light shield film patterns respectively formed on the phase shift film patterns, the light shield film patterns having size smaller than that of the phase shift film patterns; and
    a groove formed on another surface opposite said one surface of the transparent substrate, the groove having a depth which allows irradiated light to pass through the groove, resulting in a 180 degree phase shift; the groove extending from the center of a portion of the phase shift film pattern which is not overlapped by the light shield film pattern to the center of a portion of an adjacent phase shift film pattern which is not overlapped by the light shield film pattern, whereby for each phase shift and light shield film pattern pair, a phase of the light changes 180 at an edge of the phase shift film pattern and an edge of the groove as the light passes through the phase shift mask, resulting in the phase varying three times between an edge of the light shield film pattern and the center of the groove in a sequential manner.

2. The phase shift mask in accordance with claim 1, wherein the phase shift film pattern is selected from the group consisting of a spin-on-glass film, an oxide film and a nitride film.

3. A method for fabricating a phase shift mask, comprising the steps of:
    forming a groove on one surface of a transparent substrate; the groove having a depth which allows irradiated light to pass through the groove, resulting in a 180 degree phase shift;
    forming phase shift film patterns on another surface opposite said one surface of the transparent substrate, said phase shift film patterns having portions overlapping with the groove; and
    forming light shield film patterns respectively on the phase shift film patterns such that the light shield film patterns have a size smaller than that of the phase shift film patterns whereby for each phase shift and light shield film pattern pair, a phase of the light changes 180 degrees at an edge of the phase shift film pattern and an edge of the groove as the light passes through the phase shift mask, resulting in the phase varying three times from an edge of the light shield film pattern to the center of the groove in a sequential manner.

4. The method in accordance with claim 3, wherein the phase shift film pattern is selected from the group consisting of spin-on-glass, an oxide film and a nitride film.

* * * * *